United States Patent [19]
Price et al.

[11] Patent Number: 5,576,662
[45] Date of Patent: Nov. 19, 1996

[54] COMPENSATED GAIN-CONTROLLED AMPLIFIER HAVING A WIDE LINEAR DYNAMIC RANGE

[75] Inventors: J. Michael Price, La Mesa; Charles E. Wheatley, III, Del Mar; Katherine W. White, San Diego, all of Calif.

[73] Assignee: Qualcomm Incorporated, San Diego, Calif.

[21] Appl. No.: 547,340

[22] Filed: Oct. 24, 1995

Related U.S. Application Data

[60] Continuation of Ser. No. 336,623, Nov. 9, 1994, abandoned, which is a division of Ser. No. 76,228, Jun. 14, 1993, Pat. No. 5,408,697.

[51] Int. Cl.$^6$ .............................. H03F 3/16; H03G 3/30
[52] U.S. Cl. .......................... 330/277; 330/285; 330/289
[58] Field of Search .................................. 330/277, 278, 330/279, 285, 289, 302, 310

[56] References Cited

U.S. PATENT DOCUMENTS

| | | | |
|---|---|---|---|
| 4,207,538 | 6/1980 | Goel | 330/277 |
| 4,727,337 | 2/1988 | Jason | 330/298 |
| 5,099,204 | 3/1992 | Wheatley, III | 330/279 |
| 5,107,225 | 4/1992 | Wheatley et al. | 330/279 |
| 5,192,919 | 3/1993 | Wieczorek | 330/129 |
| 5,339,046 | 8/1994 | Kornfeld et al. | 330/289 X |

FOREIGN PATENT DOCUMENTS

0537733A2  4/1993  European Pat. Off. ......... H03G 3/20

*Primary Examiner*—Steven Mottola
*Attorney, Agent, or Firm*—Russell B. Miller; Katherine W. White

[57] ABSTRACT

A high dynamic range linear automatic gain control (AGC) circuit that has independent means for temperature compensation. The temperature compensation circuit of this invention can be used in a closed-loop AGC circuit such as is required in a transceiver for compensating the gains of receiver and transmitter amplifiers to ensure that both track closely over ranges of temperature, frequency and load impedance. The temperature compensation signal is coupled to one of the two gates in a field effect transistor (FET) amplifier to maintain a constant gain function over ranges of temperature, frequency and load impedance. Thermal compensation for the transmitter amplifier is derived from the thermal compensation signal for the receiver amplifier.

12 Claims, 5 Drawing Sheets

COMPENSATED GAIN-CONTROLLED AMPLIFIER HAVING A WIDE LINEAR DYNAMIC RANGE

This is a continuation of application Ser. No. 08/336,623 filed Nov. 9, 1994, now abandoned, which is a divisional of application Ser. No. 08/076,228, filed Jun. 14, 1993, now U.S. Pat. No. 5,408,697.

BACKGROUND OF THE INVENTION

1. Field of the Invention

This invention relates to automatic gain control (AGC) circuits for linear amplifiers and, more specifically, to an improved temperature-compensated AGC circuit having a wide linear dynamic range.

2. Description of the Related Art

The use of automatic gain control (AGC) circuits to control amplifier gain in communication transceivers has been accomplished by various circuit designs. Typically, the dynamic range of gain control in such amplifiers is somewhat limited. This is especially true with field-effect transistor (FET) linear amplifier circuits because of the somewhat constrained linear operating region of the typical single and dual gate FET.

Amplifier gain control is also known to drift substantially with changes in circuit temperature. Temperature compensation for AGC of linear amplifiers has also been accomplished by various circuit designs. Compensation for temperature-induced drift imposes requirements different from those associated with compensation for nonlinearities in device characteristics at signal amplitude extremes.

In certain applications, such as in code division multiple access (CDMA) cellular telephone or personal communications device transceivers, where transmitter power control and receiver AGC are essential to proper system operation, the transmitter and receiver amplifiers must both track each other in gain over a relatively high dynamic signal range. In such an environment, the receiver amplifier may be required to respond linearly to a gain control signal over an 80 dB range of gain.

In U.S. Pat. No. 5,099,204, issued Mar. 24, 1992 entitled "LINEAR GAIN CONTROL AMPLIFIER" assigned to the assignee hereof, and entirely incorporated herein by this reference, Charles E. Wheatley III et al. discloses a linear gain control amplifier design having a compensation circuit that generates a compensation signal according to predetermined device characteristics. Wheatley et al compensation signal serves to linearize the nonlinear FET device characteristics at the extremes of the dynamic operating region, thereby ensuring linear amplifier gain control over a wide dynamic range. Wheatley et al. also suggests the use of a thermistor in the AGC compensation circuit to compensate for thermal drift.

In many digital communication systems, the transceiver AGC loop must provide a signal that is a logarithmic indication of a measured received signal power over a range of signal power levels. In a digital receiver, the amplified received signal power must be limited for proper signal processing of the received signal. In the cellular transceiver environment, a digital receiver may receive a signal that experiences rapid variations in signal power over a wide range. This rapid linear AGC requirement is made more difficult by the gain-tracking requirement for both receiver amplifier and transmitter amplifier in a CDMA cellular telephone transceiver. That is, in a typical digital receiver, the level of received signal power is detected, digitized and then measured. The measured value is then typically compared with a predetermined control value and a digital error signal generated. This error signal is then used to control the gain of both the receiver amplifier and the transmitter amplifier so as to adjust both received and transmitted signal strength to coincide with the respective desired signal powers. The receiver amplifier gain is carefully controlled to permit proper signal processing of the received signal. The transmitter amplifier gain is also carefully controlled to ensure sufficient signal strength in the channel without unnecessary power consumption. This demanding set of transceiver amplifier gain requirements is further exacerbated by variations in thermal drift characteristics throughout the transceiver.

Practitioners have proposed various techniques for overcoming the cellular telephone transceiver amplifier gain linearity problem. For instance, in U.S. Pat. No. 5,107,225, issued Apr. 21, 1992 entitled "HIGH DYNAMIC RANGE CLOSED LOOP AUTOMATIC GAIN CONTROL CIRCUIT" assigned to the assignee hereof and fully incorporated herein by this reference, Charles E. Wheatley, III, et al disclose a high dynamic range closed-loop AGC circuit that automatically controls transmitter and receiver amplifier gain responsive to an indication of the strength of a received signal. Wheatley, et al teach a method for combining the received signal strength indication (RSSI) with device characteristic compensation signals to provide a system wherein both the receiver and transmitter amplifier gains in decibels vary linearly with respect to a control signal over a broad dynamic range.

In these and other applications, a clear felt need is present in the art for a method for compensating amplifier gain for variations in temperature to ensure that two such amplifiers can track each other over a wide dynamic operating region. The related unresolved problems and deficiencies are clearly-felt in the art and are solved by this invention in the manner described below.

SUMMARY OF THE INVENTION

This invention solves the temperature-compensated gain tracking problem by adding a gain independent compensation circuit for creating a second compensation signal responsive to temperature according to a predetermined characteristic. The method of this invention can be used with low-cost amplifiers employing dual-gate FET devices or with any other suitable linear amplification device known in the art.

The compensation circuit employs a thermistor to provide a receiver gain compensation signal for use in adjusting the receiver amplifier gain responsive to temperature. This receiver gain compensation signal is then modified according to a second predetermined characteristic to create a transmitter amplifier gain compensation signal suitable for adjusting transmitter amplifier gain responsive to temperature.

The temperature compensation method of this invention can be applied to the dual-gate FET linear gain control amplifier taught by Wheatley et al. in the above-cited U.S. Pat. No. 5,099,204 and to the receiver and transmitter amplifier AGC loop taught by Wheatley et al. in the above-cited U.S. Pat. No. 5,107,225 by adding a second compensation circuit according to this invention and then applying the resulting temperature-compensation control signals to the first gate circuit in each amplifier stage.

It is an object of the circuit of this invention to compensate the gain of two linear amplifiers in a transceiver in a manner that preserves the linear gain tracking features of such amplifiers. It is a feature of the circuit of this invention that the temperature compensation control signals are applied to the first gate of each FET stage, thereby being isolated from the device characteristic gain compensation signals applied to the second gate thereof according to the above-cited patents.

The foregoing, together with other objects, features and advantages of this invention, will become more apparent when referring to the following specification, claims and the accompanying drawing.

BRIEF DESCRIPTION OF THE DRAWINGS

For a more complete understanding of this invention, reference is now made to the following detailed description of the embodiments as illustrated in the accompanying drawings, wherein.

DESCRIPTION OF THE PREFERRED EMBODIMENTS

Figure 1:
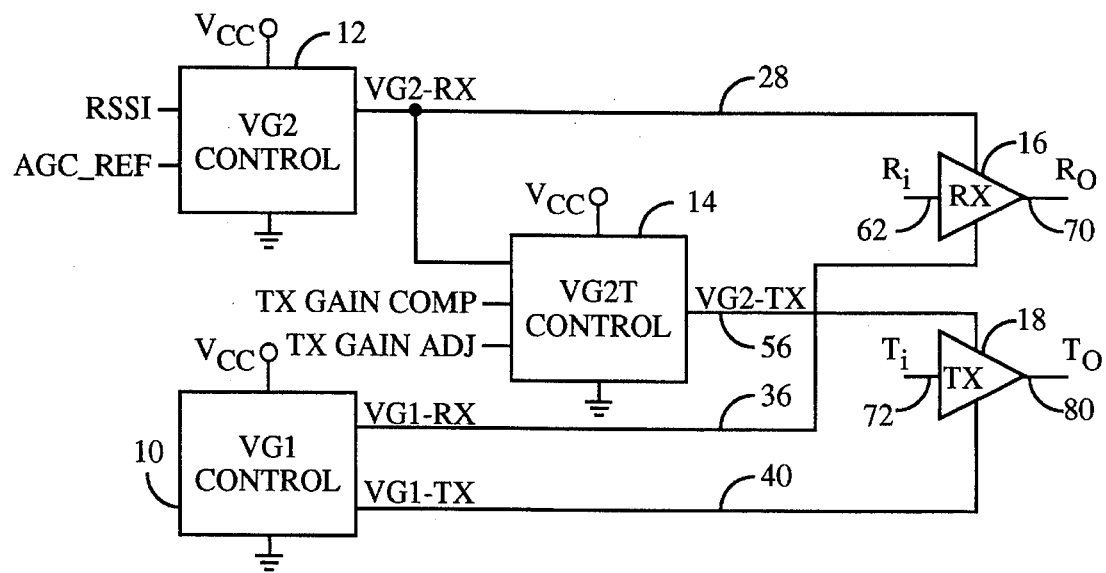
FIG. 1 shows a functional block diagram of an illustrative gain-controlled transceiver amplifier circuit incorporating the thermal compensation method of this invention.

FIG. 1 provides a functional block diagram of selected elements of a typical transceiver, including the temperature compensation circuit 10 of this invention. A receiver amplifier device compensation circuit 12 and transmitter amplifier device compensation circuit 14 are configured in accordance with the teachings of Wheatley et al. in the above-cited U.S. Pat. No. 5,107,225 incorporated herein. In cases where the required linear gain does not exceed the linear gain region of amplifiers 16 and 18, circuits 12 and 14 need not compensate for the nonlinearities. Receiver amplifier 16 and transmitter amplifier 18 are each shown having two compensation signal inputs in accordance with the thermal compensation method of this invention.

Figure 2:
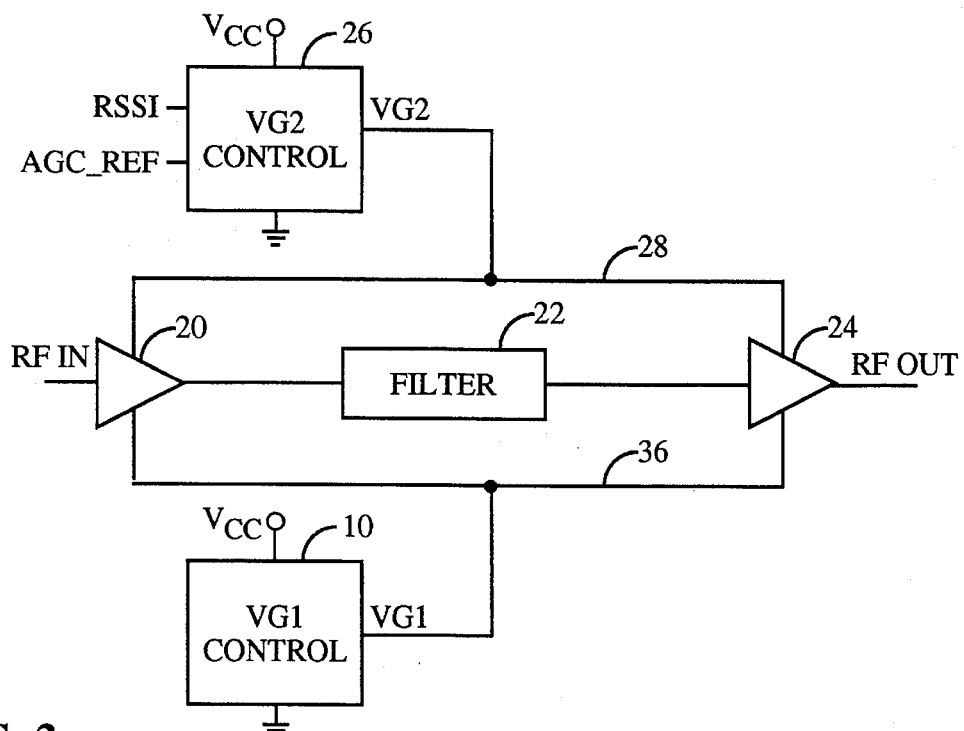
FIG. 2 provides a simple block diagram of a single two-stage amplifier employing the temperature compensation circuit of this invention.

FIG. 2 provides a simple block diagram of a single two-stage amplifier employing the temperature compensation circuit 10 of this invention. A first amplifier stage 20 is coupled through a filter 22 to a second amplifier stage 24 in a configuration that can be best appreciated with reference to the teachings of Wheatley et al. in the above-cited U.S. Pat. No. 5,099,204 incorporated herein. The single amplifier device gain compensation circuit 26 functions similarly to circuits 12 and 14 (FIG. 1) except that one device gain compensation signal is provided on line 28 to both amplifiers 20 and 24. Note that circuit 26 need not compensate for nonlinearities in cases where the amplifiers do not exceed their range of linear operation.

Figure 3:
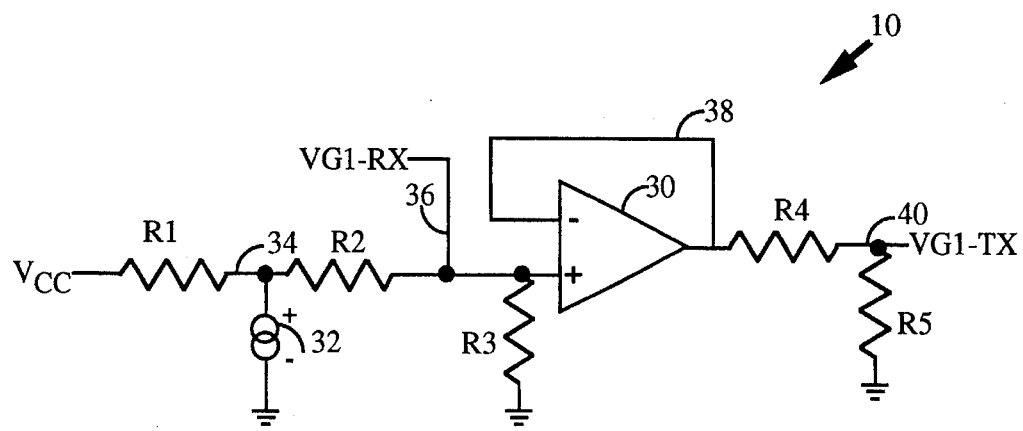
FIGS. 3 and 4 are illustrative embodiments of the temperature and device compensation control circuits from FIGS. 1 and 2.
Figure 4:
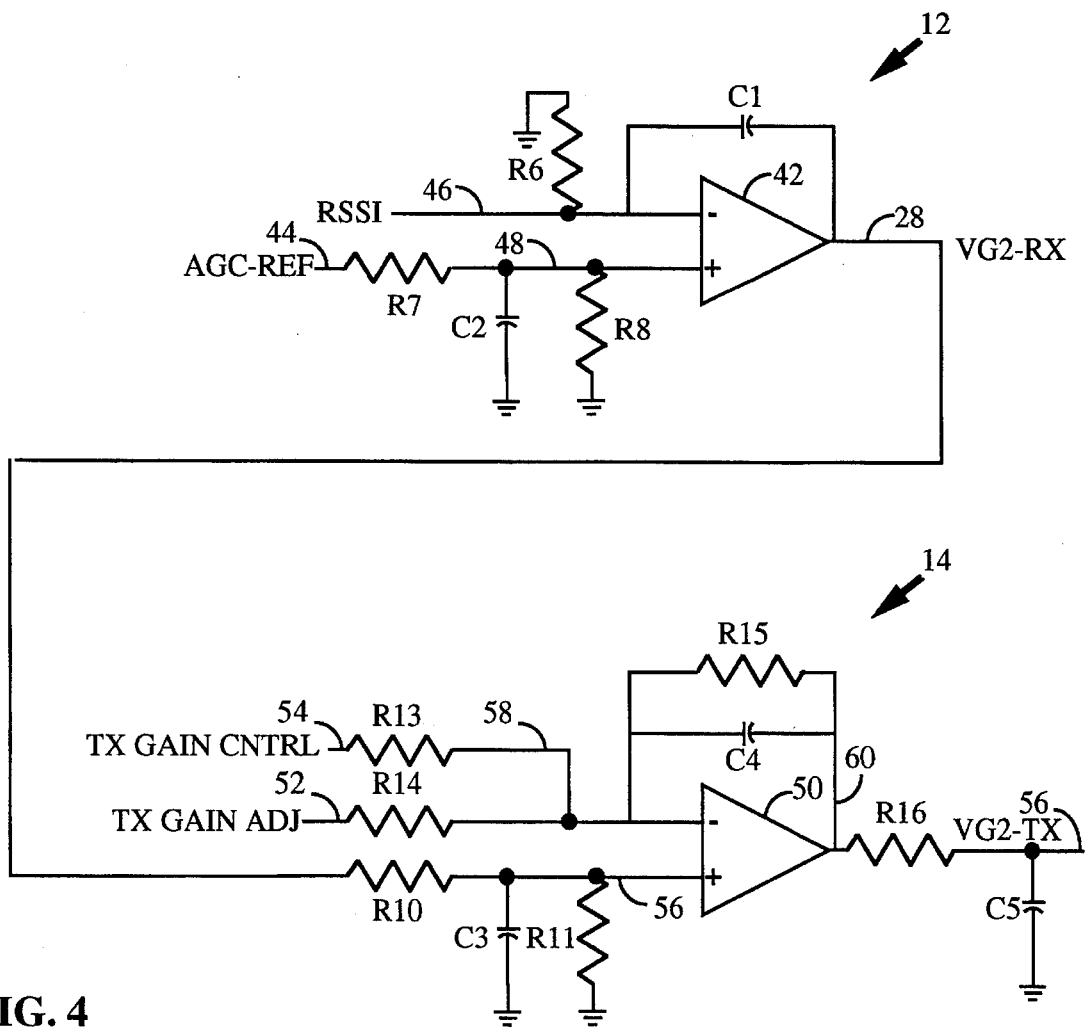

FIGS. 3 and 4 provide preferred embodiments of the temperature compensation circuit 10 and device compensation circuits 12 and 14 from FIG. 1. FIG. 3 shows circuit 10 having a single operational amplifier (op amp) 30 and a thermistor 32. In operation, circuit 10 first divides the power supply voltage $V_{CC}$ across a resistor R1 and thermistor 32 to create intermediate voltage 34. Intermediate voltage 34 is divided across a voltage divider formed by two resistors R2 and R3. The resulting voltage on line 36 is a thermal compensation signal (VG1-RX) for receiver amplifier 16 (FIG. 1) and for amplifiers 20 and 24 (as VG1) in FIG. 2.

The thermal gain compensation signal is also presented to the noninverting input of operational amplifier 30, which is configured to operate as a unity gain isolation amplifier. Thus, the output signal on line 38 is equal in amplitude to temperature gain compensation signal 36 created at the amplifier output. The output signal on line 38 is divided by the resistors R4 and R5 to create a second thermal compensation signal on line 40. The second thermal compensation signal is provided as the transmitter amplifier thermal compensation signal (VG1-TX) shown in FIG. 1. The thermal compensation signals for transmit and receive in this example are different due to differences in the transmit and receive amplifiers. Differences which cause the creation of two thermal compensation signals can include the device type, the impedance that the device drives, or the frequency at which the device operates. In the general case, the thermal compensation signal could be the same for the receive and transmit circuitry.

FIG. 4 shows a preferred embodiment of receiver amplifier device compensation circuit 12 (FIG. 1). Circuit 12 employs an operational amplifier 42 to compare an AGC reference signal at line 44 and a received signal strength indicator (RSSI) signal at line 46, producing on line 28 the amplifier device gain compensation signal (VG2-RX of FIG. 1 and VG2 of FIG. 2). In operation, circuit 12 accepts on line 46 the RSSI signal from a high impedance source at the inverting input of operational amplifier 42. The device compensation signal provided on line 28 is fed back through capacitor C1 to the noninverting input of op amp 42. Thus, op amp 42 is configured as an integrator with resistor R6 setting the time constant. The AGC reference signal provided on line 44 is divided by the resistors R7 and R8, and the resulting divided signal 48 is presented to the noninverting input of operational amplifier 42. The capacitor C2 coupled across resistor R8 acts as a roll-off filter at higher frequencies. Thus, the device compensation signal represents the difference between the low-frequency components of the RSSI and AGC reference signals.

FIG. 4 also provides a preferred embodiment for transmitter amplifier device compensation circuit 14 from FIG. 1. Circuit 14 is not used in the circuit of FIG. 2. An operational amplifier 50 is employed to combine the receiver amplifier device gain compensation signal with a transmitter gain adjustment signal, provided at line 52, and a transmitter gain control signal provided at line 54 to produce the transmitter amplifier device gain compensation signal (VG2-TX) at line 56 as shown in FIG. 1. The receiver amplifier device gain compensation signal on line 28 is presented to the low pass voltage divider made up of resistors R10 and R11 and bypass capacitor C3, which removes all significant AC components from the receiver amplifier device gain compensation signal. The divided filtered signal at line 56 is presented to the noninverting input of operational amplifier 50.

The transmitter gain control signal on line 54 and the transmitter gain adjustment signal on line 52 are combined through resistors R13 and R14 respectively and presented on line 58 to the inverting input of operational amplifier 50. The op amp output signal presented on line 60 is fed back through the nonlinear divider network made up of R15 and C4 to inverting input of op amp 50 such that op amp 50 operates as a low pass summer. Finally, the op amp output signal on line 60 is divided through the network made up of resistor R16 and capacitor C5 to produce on line 56 the transmitter amplifier device gain compensation signal (VG2-TX). Each of the above linear and nonlinear voltage divider networks interact to provide the necessary characteristics for proper device gain compensation signal level at line 56.

Figure 5:
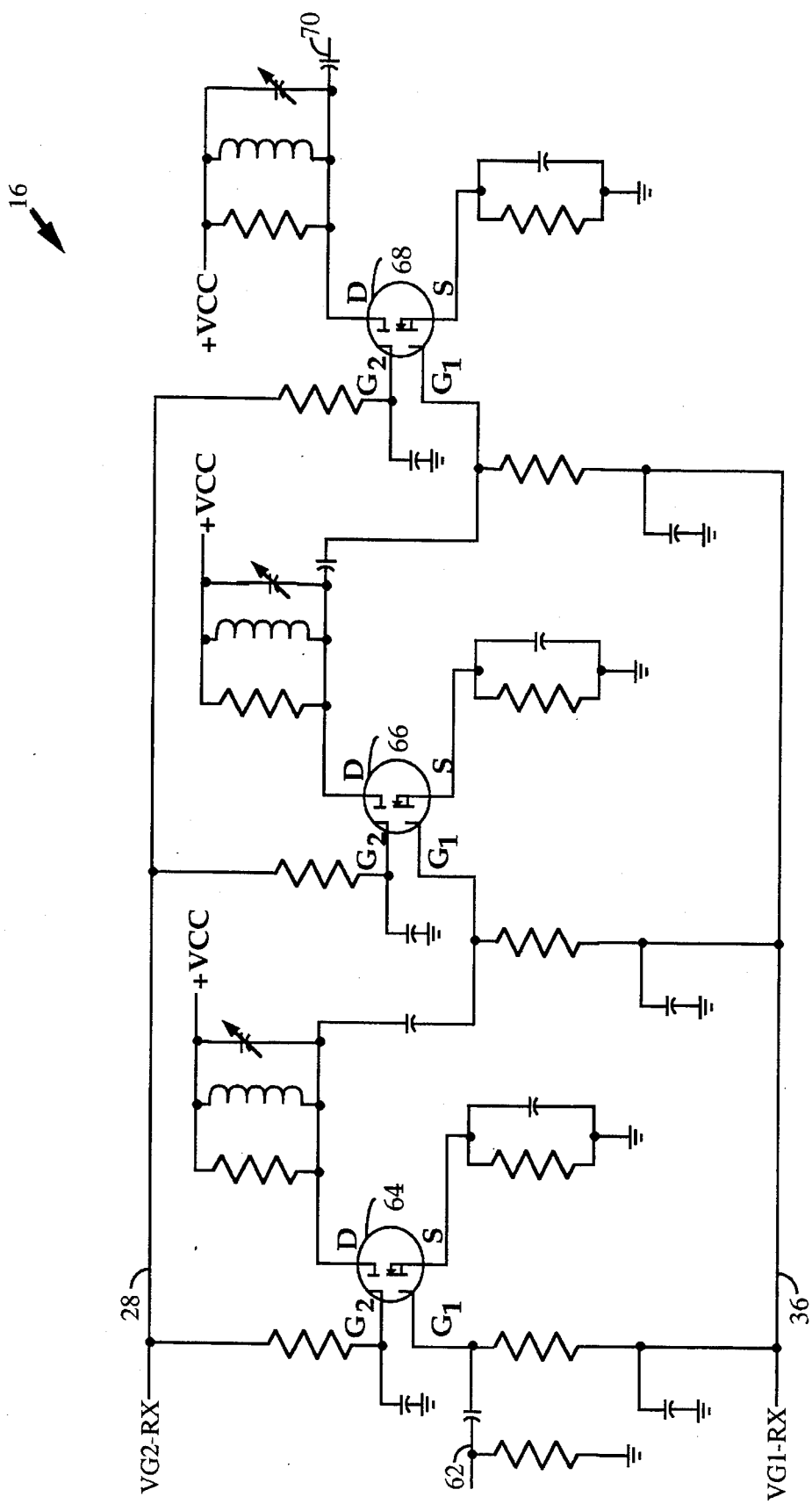
FIG. 5 is an illustrative embodiment of the receiver amplifier from FIG. 1.

FIG. 5 provides an illustrative three-stage embodiment of receiver amplifier 16 from FIG. 1. Each of the three stages employs a dual-gate field effect transistor (FET). A received signal is input to amplifier 16 at line 62 and is amplified through a first stage employing the FET 64, a second stage employing the FET 66 and a third stage employing the FET 68, which creates the output signal at line 70. The receiver amplifier thermal compensation signal (VG1-RX of FIG. 1 and VG1 of FIG. 2) as provided on line 36 of FIG. 5 is introduced through a series resistor to the first gate G1 of each FET 64, 66, and 68, as shown in FIG. 5. Similarly, the receiver amplifier device gain compensation signal (VG2-RX of FIG. 1 and VG2 of FIG. 2) as provided on line 28 of FIG. 4 is presented through a series resistor to the second gate G2 of each FET. The nonlinear circuits coupled to the drains of each FET stage are tuned networks designed to present a purely resistive load to the drain of each FET stage. Receiver amplifier 16 is tuned to an intermediate carrier frequency predetermined for the transceiver illustrated in FIG. 1, which could be 70 MHz, for instance.

Figure 6:
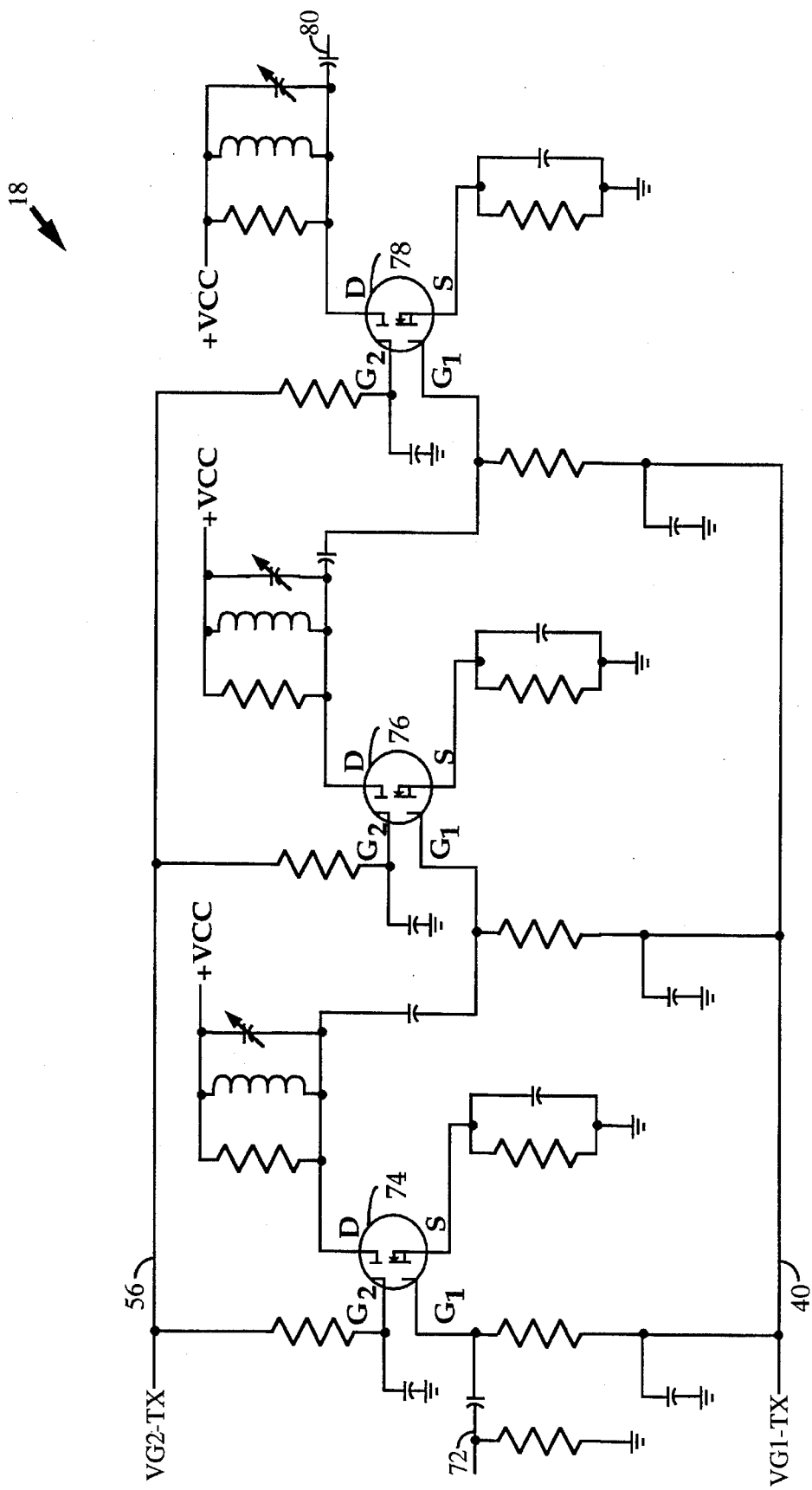
FIG. 6 is an illustrative embodiment of the transmitter amplifier from FIG. 1.

FIG. 6 shows an illustrative embodiment of transmitter amplifier 18 from FIG. 1. Amplifier 18 is very similar to amplifier 16 (FIG. 5) in that it is a three-stage dual-gate FET tuned amplifier. Amplifier 18 is tuned to the transmitter intermediate carrier frequency predetermined for the transceiver illustrated in FIG. 1, which could be 115 MHz, for instance. The transmitter intermediate carrier signal is presented at amplifier input 72, and is subsequently amplified by the three FET stages, which include FETs 74, 76, and 78. The third stage output signal is at line 80. Again, as in FIG. 5, the transmitter amplifier thermal compensation signal (VG1-TX of FIG. 1) as provided on line 40 of FIG. 3 is coupled through a series resistor at the first gate G1 of each FET. The transmitter amplifier device gain compensation signal (VG2-TX of FIG. 1) as provided on line 56 of FIG. 4 is independently coupled through a series resister at the second gate G2 of each FET.

In both FIGS. 5 and 6, the two independent signals, one setting the gain of the device and the other for compensating for changes in the gain as a function of temperature, are introduced into each FET stage by exploiting the dual-gate feature of each FET. This architecture provides for compensation with a simple temperature compensation signal that is independent of the gain control mechanism of the device.

Figure 7:
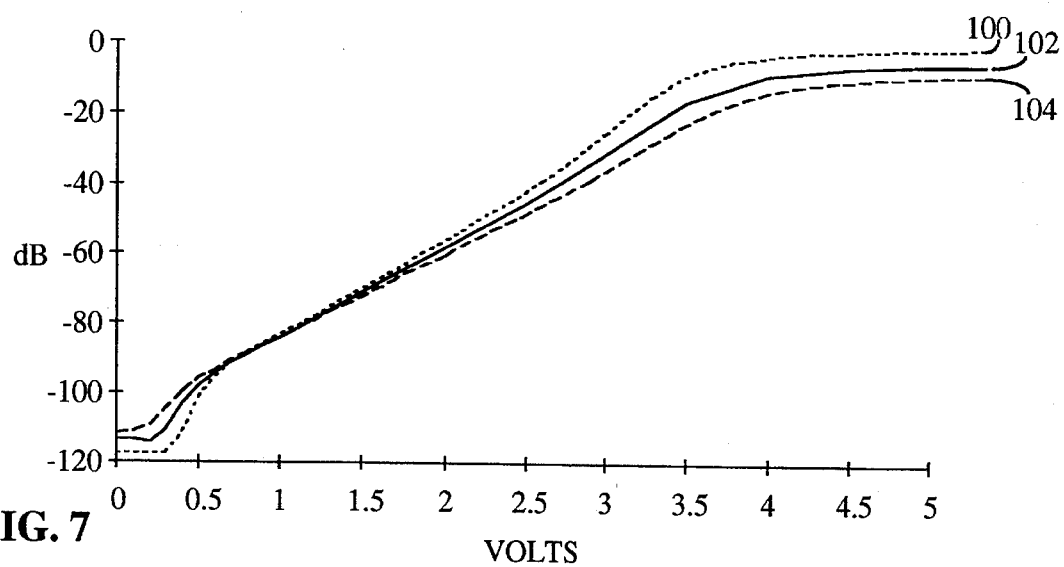
FIG. 7 shows a logarithmic device gain control ratio as a function of temperature.

FIG. 7 illustrates the need for temperature compensation in a FET circuit that is being used as a variable gain amplifier. In FIG. 7, experimental data is presented at three different temperatures. The horizontal axis represents the voltage level applied to the second gate G2 of the FET stages and the vertical axis represents the gain of the FET stages normalized such that the highest measured gain is 0 dB. The portion of the curve from about 0.5 Volts up to about 3.5 Volts, where the response of the circuit is nearly linear, is representative of the useful range of the FET stages. (The range could be extended using the techniques described in previously mentioned U.S. Pat. No. 5,107,225.) Curve 102 graphs the normalized gain as a function of the second gate G2 voltage of a set of FET's at room temperature. Curve 100 graphs the normalized gain of the same circuit at a reduced temperature. Curve 100 is linear over a similar region as curve 102 but is steeper in slope. Curve 100 diverges from curve 102 causing a temperature error of more than 7 dB at a second gate G2 voltage of about 3.5 Volts. Curve 104 graphs the normalized gain of the same circuit at an elevated temperature. Curve 104 is linear over a similar voltage as curve 102 but is less steep in slope. Curve 104 diverges from curve 102 causing a temperature error of more than −6 dB at a second gate G2 voltage of 3.5 Volts. The temperature compensation mechanism of the present invention seeks to compensate for the change in slope seen in FIG. 7.

Figure 8:
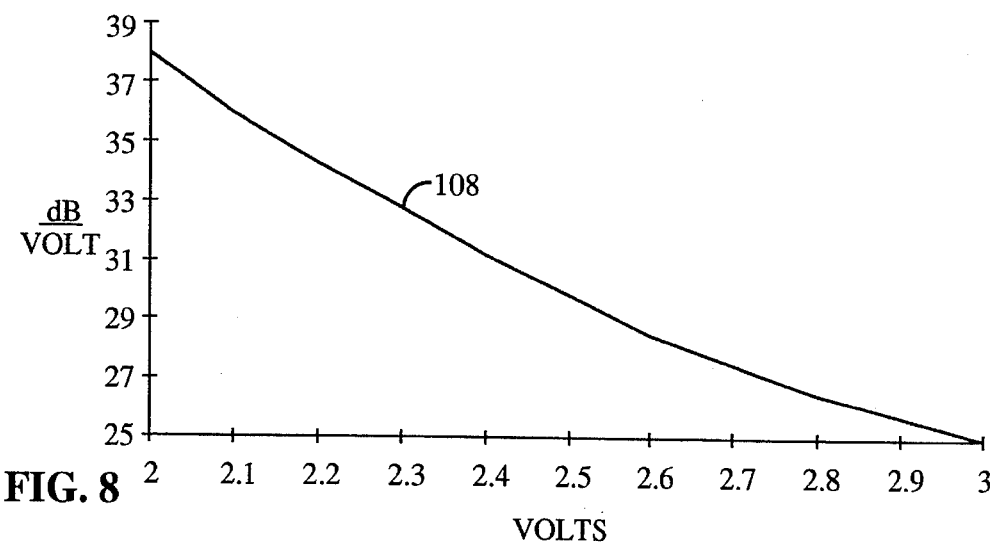
FIG. 8 shows the effect of first gate voltage on the slope of the gain control.

FIG. 8 graphs the slope of the same FET stages of FIG. 7 over a range of first gate G1 of voltages at a fixed temperature. The measured data reflects the ability of first gate G1 voltage to change the slope of the gain curve. In FIG. 8 the horizontal axis represents the voltage level applied to the first gate G1 of the FET stages in volts. The vertical axis represents the change in gain from a second gate G2 voltage equal to one volt to a second gate G2 voltage equal to two volts and has units of dB/volt. Since first gate G1 voltage can be used to change the slope of the gain curve, first gate G1 voltage can be used to compensate for the effect of temperature on the slope of the gain curve independent of any specific value of second gate G2 voltage. The present invention creates a G1 voltage that is a function of temperature and thus compensates for the slope change caused by temperature by counteracting the temperature change with a change in first gate voltage G1 having the opposite effect on slope.

Figure 9:
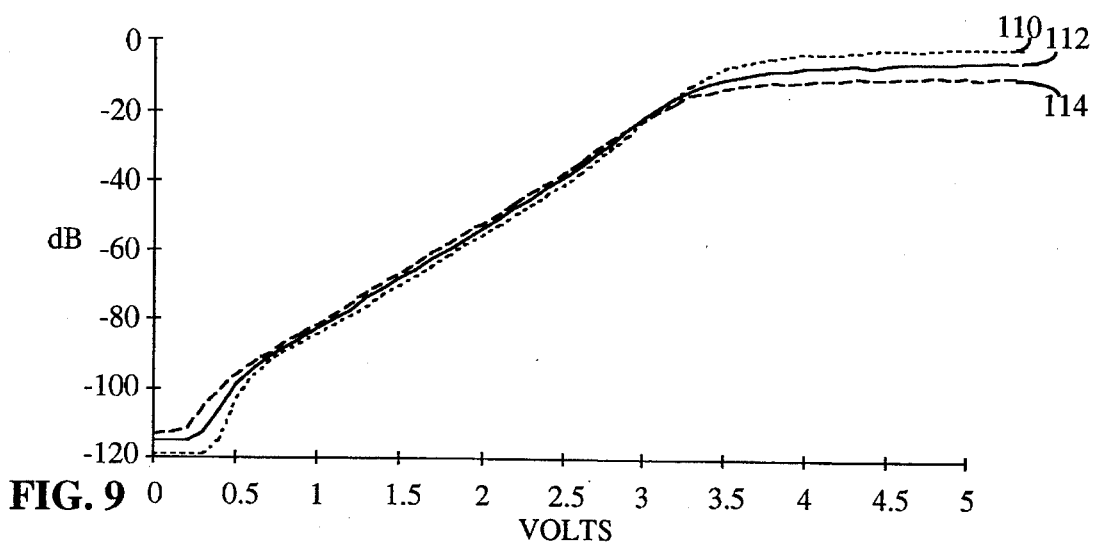
FIG. 9 shows the linear gain error in decibels as a function of device gain compensation voltage after adding the temperature compensation control circuit of FIG. 3.

In FIG. 7, the first gate G1 voltage was held constant over temperature. In FIG. 9 using the same FET stages, the value of the voltage applied to the first gate G1 is changed as a function of temperature and the curves of FIG. 9 track tightly over temperature. Curve 112 represent the gain curve a room temperature while Curves 110 and 114 represent the gain curve at a reduced and elevated temperature respectively. The error over the useful range for the FET stages is a reduced function of temperature and the slope of the three curves is nearly identical. The error between the three lines is about 1 dB which is a significant improvement over FIG. 7.

Clearly, other embodiments and modifications of this invention will occur readily to those of ordinary skill in the art in view of these teachings. For instance, if an even smaller error is desired than the results shown in FIG. 9, it may be advantageous to add a temperature dependence to the gain compensation signal also. Simply adding the temperature compensation signal (or a scaled version thereof) to the gain compensation signal achieves a temperature dependence of the gain compensation signal. The effect of such compensation would be to overlay the parallel lines of FIG. 9.

The previous description of the preferred embodiments is provided to enable any person skilled in the art to make or use the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

We claim:

1. An amplifier circuit for amplifying a received signal, the amplifier circuit comprising:
   a gain setting circuit for generating a gain compensation signal which remains constant as a function of temperature;
   a temperature sensing circuit for generating a temperature compensation signal which remains constant as a function of said gain compensation signal, and
   a dual gate field effect transistor circuit having a first gate coupled to said temperature sensing circuit and coupled to said receive signal and a second gate coupled to said gain setting circuit, the field effect transistor generating an amplified signal from the received signal in response to the temperature compensation signal and the gain compensation signal.

2. An amplifier circuit providing temperature independent gain to a modulated signal comprising:
   a gain control circuit generating independent of a current temperature a gain control signal indicative of a desired level of gain;
   a temperature control circuit generating a temperature compensation signal indicative of said current temperature wherein said temperature compensation signal is independent of said desired level of gain; and
   a dual gate field effect transistor circuit having a first gate receiving said temperature compensation signal and said modulated signal and a second gate receiving said gain control signal, said dual gate field effect transistor having a drain producing an amplified version of said modulated signal having an amplification dependent on the value of said gain control signal and independent of said current temperature.

3. The amplifier circuit of claim 2 further comprising a second dual gate field effect transistor circuit having a first gate receiving said temperature compensation signal and said amplified version of said modulated signal and a second gate receiving said gain control signal, said second dual gate field effect transistor having a drain producing an amplified version of said amplified version of said modulated signal having an amplification dependent on the value of said gain control signal and independent of said current temperature.

4. The amplifier circuit of claim 2 wherein said desired gain is a linear function of said value of said gain control signal.

5. The amplifier circuit of claim 2 wherein said gain control circuit comprises an operational amplifier configured to act as an integrator having an noninverting input receiving a reference signal indicative of a desired amplitude level of said amplified version of said modulated signal, and having an inverting input receiving a signal indicative of an actual amplitude level of said amplified version of said modulated signal.

6. The amplifier circuit of claim 2 comprising:
   a second gain control circuit generating independent of a current temperature a second gain control signal indicative of a second desired level of gain; and
   a second dual gate field effect transistor circuit having a first gate receiving said temperature compensation signal and a second modulated signal and a second gate receiving said second gain control signal, said dual gate field effect transistor having a drain producing an amplified version of said second modulated signal having an amplification dependent on the value of said second gain control signal and independent of said current temperature.

7. The amplifier circuit of claim 6 wherein said second gain control circuit receives said gain control signal.

8. The amplifier circuit of claim 7 wherein said gain control signal is indicative of an absolute amplitude level of said modulated signal.

9. The amplifier circuit of claim 2 wherein said gain control circuit comprises an operation amplifier having a nonlinear feed back element.

10. The amplifier circuit of claim 6 wherein said modulated signal is received from an antenna.

11. The amplifier circuit of claim 10 wherein said amplified version of said modulated signal has an amplitude that varies over a smaller dynamic range than said modulated signal.

12. The amplifier circuit of claim 11 wherein said amplified version of said second modulated signal has an amplitude that varies over a larger dynamic range than said second modulated signal.

* * * * *